United States Patent
Kishizawa et al.

(10) Patent No.: US 11,903,316 B2
(45) Date of Patent: Feb. 13, 2024

(54) THERMOELECTRIC MODULE

(71) Applicant: KELK Ltd., Kanagawa (JP)

(72) Inventors: Toshihiko Kishizawa, Kanagawa (JP); Shinichi Fujimoto, Kanagawa (JP); Manabu Ishii, Tokyo (JP); Hideaki Yamagishi, Tokyo (JP); Fumitaka Ueno, Tokyo (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 17/282,532

(22) PCT Filed: Oct. 4, 2019

(86) PCT No.: PCT/JP2019/039273
§ 371 (c)(1),
(2) Date: Apr. 2, 2021

(87) PCT Pub. No.: WO2020/071529
PCT Pub. Date: Apr. 9, 2020

(65) Prior Publication Data
US 2021/0351333 A1    Nov. 11, 2021

(30) Foreign Application Priority Data

Oct. 5, 2018   (JP) .................................. 2018-190383
May 29, 2019  (JP) .................................. 2019-100588

(51) Int. Cl.
*H10N 10/817*  (2023.01)
*H10N 10/852*  (2023.01)
*H10N 10/01*   (2023.01)

(52) U.S. Cl.
CPC ......... *H10N 10/817* (2023.02); *H10N 10/852* (2023.02); *H10N 10/01* (2023.02)

(58) Field of Classification Search
None
See application file for complete search history.

(56) References Cited

U.S. PATENT DOCUMENTS

2012/0156512 A1   6/2012  Nakano et al.
2013/0032188 A1*  2/2013  Kajihara ................. H01L 35/28
                                                        136/200
(Continued)

FOREIGN PATENT DOCUMENTS

CN      102754230 A    10/2012
CN      105027307 A    11/2015
(Continued)

OTHER PUBLICATIONS

English machine translation of Hitoshi et al. (JP 2003-133599 A) provided by the EPO website, 2021, All Pages. (Year: 2021).*

(Continued)

*Primary Examiner* — Daniel P Malley, Jr.
(74) *Attorney, Agent, or Firm* — Fish & Richardson P.C.

(57) ABSTRACT

A thermoelectric module includesa plurality of electrodes (high temperature side electrodes and low temperature side electrodes, thermoelectric conversion elements (p-type element and n-type element) arranged between the two electrodes, and a bonding layer disposed between the electrodes and the thermoelectric conversion elements. The bonding layer includes copper-containing particles, copper balls each having a particle diameter of 30 μm or more, an intermetallic compound of copper and tin, and a fired resin.

20 Claims, 4 Drawing Sheets

(56) References Cited

U.S. PATENT DOCUMENTS

| | | | | |
|---|---|---|---|---|
| 2016/0141479 A1* | 5/2016 | Matsunami | ............. | H01L 35/10 136/238 |
| 2016/0163944 A1* | 6/2016 | Fujimoto | ................ | H01L 35/04 136/205 |
| 2016/0172569 A1* | 6/2016 | Fujimoto | ................ | H01L 35/16 136/238 |
| 2019/0189887 A1* | 6/2019 | Kwak | ................... | H10N 10/854 |
| 2020/0295248 A1* | 9/2020 | Negishi | ..................... | C22C 5/06 |

FOREIGN PATENT DOCUMENTS

| | | | | | |
|---|---|---|---|---|---|
| CN | 105359285 | A | | 2/2016 | |
| CN | 105637661 | A | | 6/2016 | |
| CN | 105934830 | A | | 9/2016 | |
| JP | 2003133599 | | | 5/2003 | |
| JP | 2003133599 | A | * | 5/2003 | |
| JP | 2004-349651 | A | | 12/2004 | |
| JP | 2009231317 | | | 10/2009 | |
| JP | 2009231317 | A | * | 10/2009 | |
| JP | 2010108958 | | | 5/2010 | |
| JP | 2017152715 | | | 8/2017 | |
| WO | WO-2010050455 | A1 | * | 5/2010 | ............. H01L 35/08 |

OTHER PUBLICATIONS

English machine translation of Tomohiro (WO 2010/050455 A1) provided by the EPO website, 2021, All Pages. (Year: 2021).*
English machine translation of Fujimoto (JP-2009231317-A) provided by the EPO website, 2022, All Pages. (Year: 2022).*
PCT International Search Report and Written Opinion in International Application No. PCT/JP2019/039273, dated Nov. 26, 2019, 3 pages (with English translation).
Office Action in Chinese Appln. No. 201980065569.7, dated Nov. 9, 2023, 12 pages (with machine translation).

* cited by examiner

THERMOELECTRIC MODULE

CROSS-REFERENCE TO RELATED APPLICATIONS

This application is a National Stage application of International Application No. PCT/JP2019/039273, filed on Oct. 4, 2019, which claims priority to Japanese Patent Application No. 2019-100588, filed May 29, 2019, and Japanese Patent Application No. 2018-190383, filed on Oct. 5, 2018. The contents of the prior applications are incorporated herein in their entirety.

FIELD

The present invention relates to a thermoelectric module.

BACKGROUND

As a thermoelectric module, for example, a thermoelectric power generation module that generates power by disposing a thermoelectric conversion element between a high temperature side heat exchanger and a low temperature side heat exchanger is known. To the thermoelectric conversion element, a thermoelectric effect such as a Seebeck effect or a Peltier effect is applied. When a semiconductor material is used as a thermoelectric material, a thermoelectric module is constituted by electrically connecting a thermoelectric conversion element formed of a p-type semiconductor thermoelectric material to a thermoelectric conversion element formed of an n-type semiconductor thermoelectric material via an electrode.

As a bonding material used for bonding the thermoelectric conversion element to the electrode, high melting point solder lead that does not increase electrical resistance between the thermoelectric conversion element and the electrode even if repeatedly receiving a thermal stress due to high temperature is used (Patent Literature 1). However, recently, in consideration of an impact of lead on environment, use of a lead-free bonding material has been required.

CITATION LIST

Patent Literature

Patent Literature 1:JP 2017-152715 A

SUMMARY

Technical Problem

As the lead-free bonding material, lead-free solder made of a tin alloy containing tin as a main component is well known. However, the melting point of the lead-free solder is lower than that of high melting point solder lead. Therefore, when a thermoelectric module using lead-free solder for bonding a thermoelectric conversion element to an electrode repeatedly receives a thermal stress due to high temperature (250 to 300° C.), electrical resistance between the thermoelectric conversion element and the electrode increases, that is, temperature cycle resistance is low.

The present invention provides a thermoelectric module having high temperature cycle resistance even though a lead-free bonding material is used for bonding a thermoelectric conversion element to an electrode.

Solution to Problem

The present invention has the following aspects.
<1>A thermoelectric module comprising:
 a plurality of electrodes;
 thermoelectric conversion elements arranged between the two electrodes; and
 a bonding layer disposed between the electrodes and the thermoelectric conversion elements,
 wherein the bonding layer contains copper-containing particles, copper balls each having a particle diameter of 30 µm or more, an intermetallic compound of copper and tin, and a fired resin.
<2>The thermoelectric module according to <1>, wherein
 copper-containing particles and copper balls each having a particle diameter of 30 µm or more are present in a cross section of the bonding layer, and
 a total area ratio of the copper-containing particles and the copper balls each having a particle diameter of 30 µm or more out of 100% of a cross-sectional area of the bonding layer is 10 to 55%.
<3>The thermoelectric module according to <1>or <2>, wherein a total area ratio of the copper-containing particles and the copper balls out of 100% of a cross-sectional area of the bonding layer is 35 to 50%.
<4>The thermoelectric module according to any one of <1>to <3>, further comprising a diffusion preventing layer disposed between the thermoelectric conversion elements and the bonding layer.
<5>The thermoelectric module according to <4>, further comprising a bondability improving layer disposed between the bonding layer and the diffusion preventing layer.
<6>The thermoelectric module according to any one of <1>to <5>, wherein the bonding layer has a thickness of 50 to 150 µm.

Advantageous Effects of Invention

A thermoelectric module according to an aspect of <1>has high temperature cycle resistance even though a lead-free bonding material is used for bonding a thermoelectric conversion element to an electrode.

A thermoelectric module according to an aspect of <2>suppresses crushing of a bonding layer during bonding between the thermoelectric conversion element and the electrode in addition to having the above effect.

A thermoelectric module according to an aspect of <3>suppresses generation of a thermal stress between the thermoelectric conversion element and the bonding layer, and suppresses breakage at an interface between the thermoelectric conversion element and the bonding layer in addition to having the above effect.

A thermoelectric module according to an aspect of <4>suppresses diffusion of an element contained in the bonding layer and a bondability improving layer into the thermoelectric conversion element, and suppresses deterioration of thermoelectric performance in the thermoelectric conversion element in addition to having the above effect.

A thermoelectric module according to an aspect of <5>has higher bonding strength between the thermoelectric conversion element and the bonding layer in addition to having the above effect.

A thermoelectric module according to an aspect of <6>has higher bonding strength between the thermoelectric conversion element and the electrode in addition to having the above effect.

DESCRIPTION OF EMBODIMENTS

Figure 1:
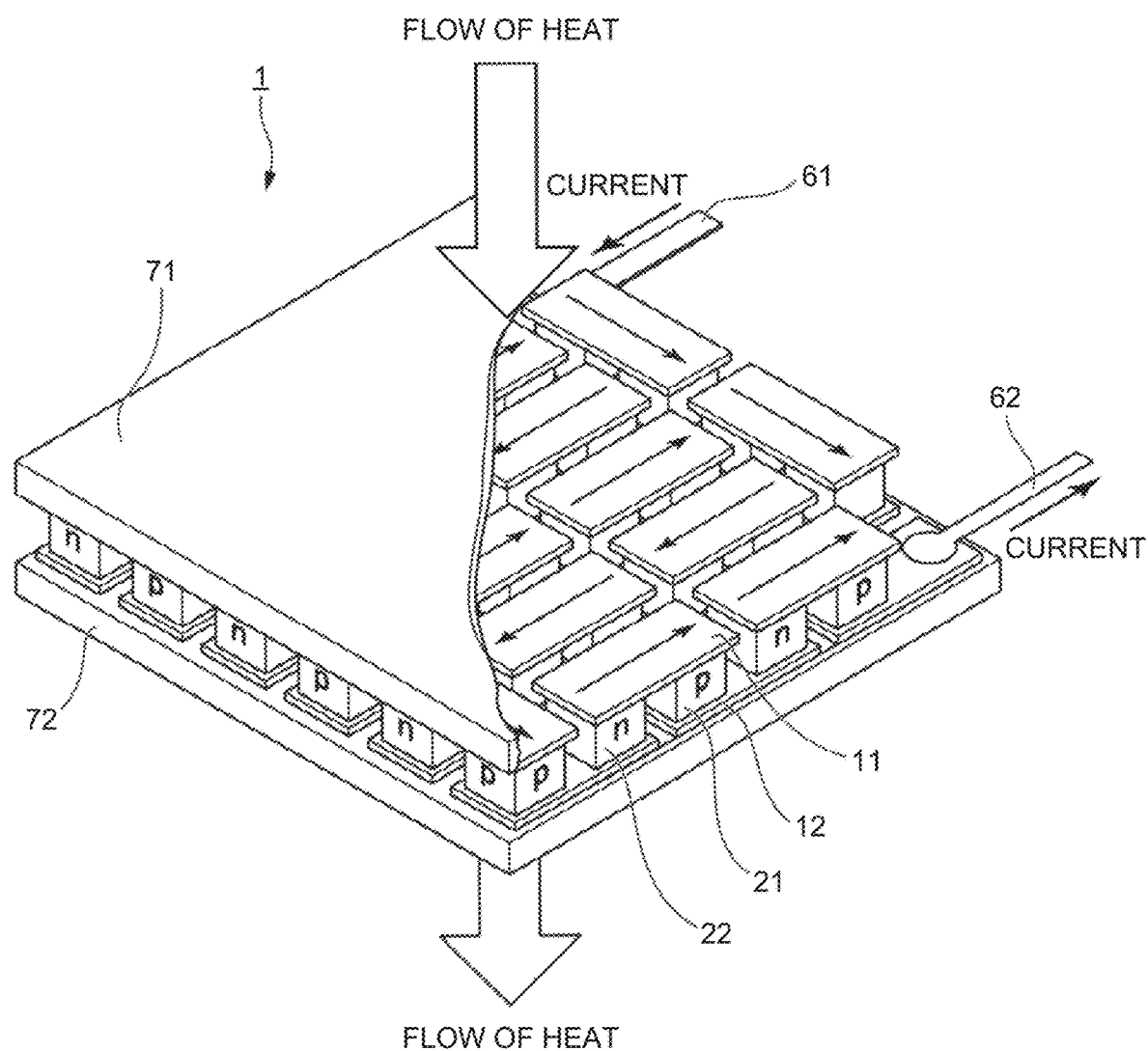
FIG. 1 is a perspective view illustrating an example of a thermoelectric module of the present invention.

The definitions of the following terms apply throughout the present specification and claims.

"Lead-free" means that the lead content is 0.10% by mass or less (see JIS Z 3282: 2006 "Solder-Chemical component and shape").

"Particle diameter of a copper-containing particle" is determined by detecting copper-containing particles using image processing software in an optical micrograph of a cross section of a bonding layer and calculating a circle-equivalent diameter from the measured area of each of the copper-containing particles. "Total area ratio of copper-containing particles and copper balls out of 100% of the cross-sectional area of a bonding layer" is determined by randomly selecting 10 bonding layers from the inside of one thermoelectric module, determining the total area ratio of the copper-containing particles and the copper balls out of 100% of the cross-sectional area of each of the bonding layers, and averaging values in 10 bonding layers. The "total area ratio of the copper-containing particles and the copper balls out of 100% of the cross-sectional area of each of the bonding layers" is determined by detecting copper-containing particles and copper balls using image processing software in an optical micrograph of the cross section of a bonding layer, measuring the area of each of the copper-containing particles and the area of each of the copper balls, summing up the area of each of the copper-containing particles and the area of each of the copper balls to determine the area of the copper-containing particles and the copper balls, and calculating a percentage of the area of the copper-containing particles and the copper balls with respect to the area of the bonding layer.

"Total area ratio of the copper-containing particles and the copper balls each having a particle diameter of 30 μm or more out of 100% of the cross-sectional area of a bonding layer" is determined by randomly selecting 10 bonding layers from the inside of one thermoelectric module, determining the total area ratio of the copper-containing particles and the copper balls each having a particle diameter of 30 μm or more out of 100% of the cross-sectional area of each of the bonding layers, and averaging values in 10 bonding layers. The "total area ratio of the copper-containing particles and the copper balls each having a particle diameter of 30 μm or more out of 100% of the cross-sectional area of each of the bonding layers" is determined by detecting copper-containing particles and copper balls using image processing software in an optical micrograph of the cross section of a bonding layer, determining the total area of only the copper-containing particles and the copper balls each having a circle-equivalent diameter of 30 μm or more out of the detected copper-containing particles and copper balls, and calculating a percentage of the total area of the copper-containing particles and the copper balls each having a circle-equivalent diameter of 30 μm or more with respect to the area of the bonding layer.

The dimensional ratios in FIGS. 1, 2, 4, 5, and 6 are different from the actual ones for convenience of explanation.

<Thermoelectric Module>

Figure 2:
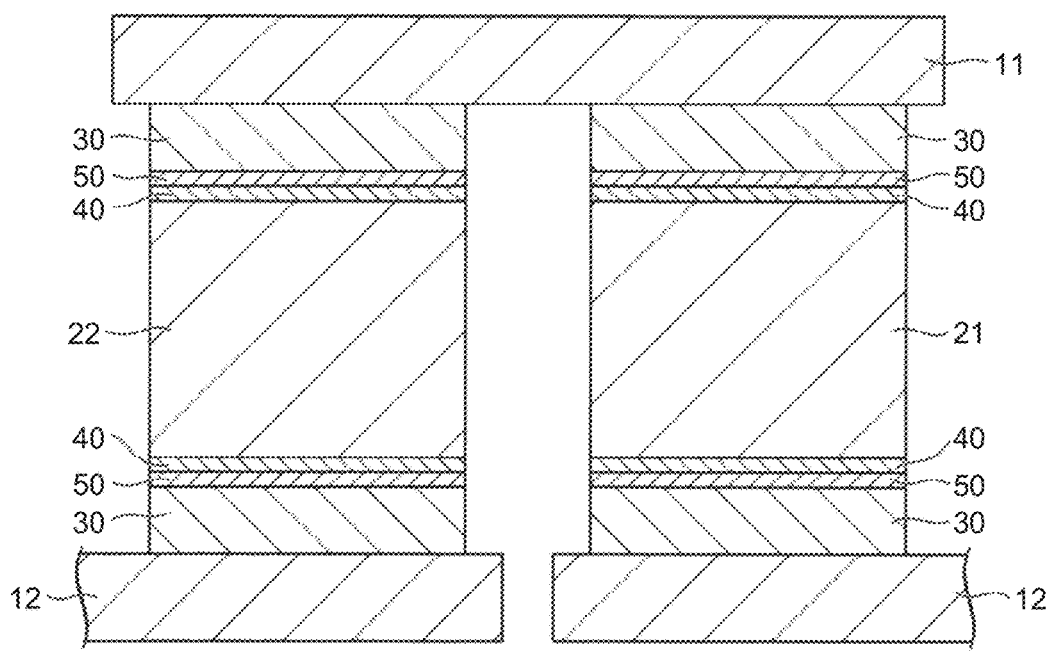
FIG. 2 is a cross-sectional view illustrating an example of a bonding portion between a thermoelectric conversion element and an electrode in the thermoelectric module of the present invention.

FIG. 1 is a perspective view illustrating an example of a thermoelectric module of the present invention, and FIG. 2 is a cross-sectional view illustrating an example of a bonding portion between a thermoelectric conversion element and an electrode.

A thermoelectric module 1 includes: a plurality of high temperature side electrodes 11 aligned on the same plane; a plurality of low temperature side electrodes 12 aligned on the same plane apart from the high temperature side electrodes 11; a plurality of thermoelectric conversion elements (p-type elements 21) made of a p-type semiconductor thermoelectric material and arranged between the high temperature side electrodes 11 and the low temperature side electrodes 12; a plurality of thermoelectric conversion elements (n-type elements 22) made of an n-type semiconductor thermoelectric material and arranged between the high temperature side electrodes 11 and the low temperature side electrodes 12; a bonding layer 30 disposed between the electrodes and the thermoelectric conversion elements; a diffusion preventing layer 40 disposed between the thermoelectric conversion elements and the bonding layer 30; and a bondability improving layer 50 disposed between the bonding layer 30 and the diffusion preventing layer 40.

In the thermoelectric module 1, the high temperature side electrodes 11 and the low temperature side electrodes 12 are arranged so as to be apart from each other while being shifted by half of the electrode. The p-type element 21 and the n-type element 22 are alternately arranged between the high temperature side electrodes 11 and the low temperature side electrodes 12. In this way, the p-type element 21 and the n-type element 22 are electrically connected to each other via the high temperature side electrode 11 or the low temperature side electrode 12 to form a pn element pair, and a plurality of pn element pairs is connected to each other in series via the low temperature side electrode 12 or the high temperature side electrode 11 to form a series circuit.

A lead 61 is electrically connected to the n-type element 22 at a starting end of the series circuit via the low temperature side electrode 12. A lead 62 is electrically connected to the p-type element 21 at a terminal end of the series circuit via the low temperature side electrode 12.

In the thermoelectric module 1, a resin frame (not illustrated) is disposed so as to surround the plurality of pn element pairs aligned in a plane direction.

In the thermoelectric module 1, a high temperature side substrate 71 and a low temperature side substrate 72 are disposed so as to sandwich the plurality of pn element pairs aligned in the plane direction and the frame via a thermally conductive grease on the surface of the electrode opposite to the thermoelectric conversion element. The high temperature side substrate 71 and the low temperature side substrate 72 each have a size covering the electrodes and the frame, and the frame does not come into direct contact with a heat source when the thermoelectric module 1 is attached to the heat source.

When heat is applied to a side of the high temperature side substrate 71 and a side of the low temperature side substrate 72 is cooled with cooling water or the like, an electromotive force is generated in the thermoelectric module 1, and a current flows when a load (not illustrated) is connected between the lead 61 and the lead 62. That is, electric power can be taken out by making a temperature difference between both sides (upper and lower sides in the drawing) of the thermoelectric module 1.

By omitting one or both of the high temperature side substrate 71 and the low temperature side substrate 72, one or both of the high temperature side electrode 11 and the low temperature side electrode 12 may be brought into contact with a surface of a heat exchanger having electrical insulation. By bringing the heat exchanger into contact with the electrode, thermoelectric conversion efficiency is improved. A thermoelectric module in which either the high temperature side substrate 71 or the low temperature side substrate 72 is omitted is called a half skeleton structure, and a thermoelectric module in which both the high temperature side substrate 71 and the low temperature side substrate 72 are omitted is called a full skeleton structure.

The high temperature side substrate 71 and the low temperature side substrate 72 are made of, for example, an electrically insulating material. Examples of the electrically insulating material include ceramics (aluminum nitride and the like).

The high temperature side electrode 11 and the low temperature side electrode 12 are made of, for example, copper having high electrical conductivity and thermal conductivity.

The p-type element 21 and the n-type element 22 are made of a thermoelectric material containing at least two elements selected from the group consisting of bismuth, tellurium, antimony, and selenium as main components. As the thermoelectric material, a Bi—Te-based thermoelectric material containing bismuth and tellurium is preferable in a temperature environment in which temperature on a module high temperature side is 250 to 300° C. at the maximum. Examples of the Bi—Te-based thermoelectric material constituting the p-type element 21 include a thermoelectric material containing bismuth, tellurium, and antimony. Examples of the Bi-13 Te-based thermoelectric material constituting the n-type element 22 include a thermoelectric material containing bismuth, tellurium, and selenium.

The bonding layer 30 contains copper-containing particles, copper balls each having a particle diameter of 30 μm or more, an intermetallic compound of copper and tin (CU—Sn intermetallic compound), and a fired resin. The bonding layer 30 is, for example, a fired product of a bonding material containing copper-containing particles, copper balls, tin-containing particles, and a resin, which will be described later.

Figure 3:
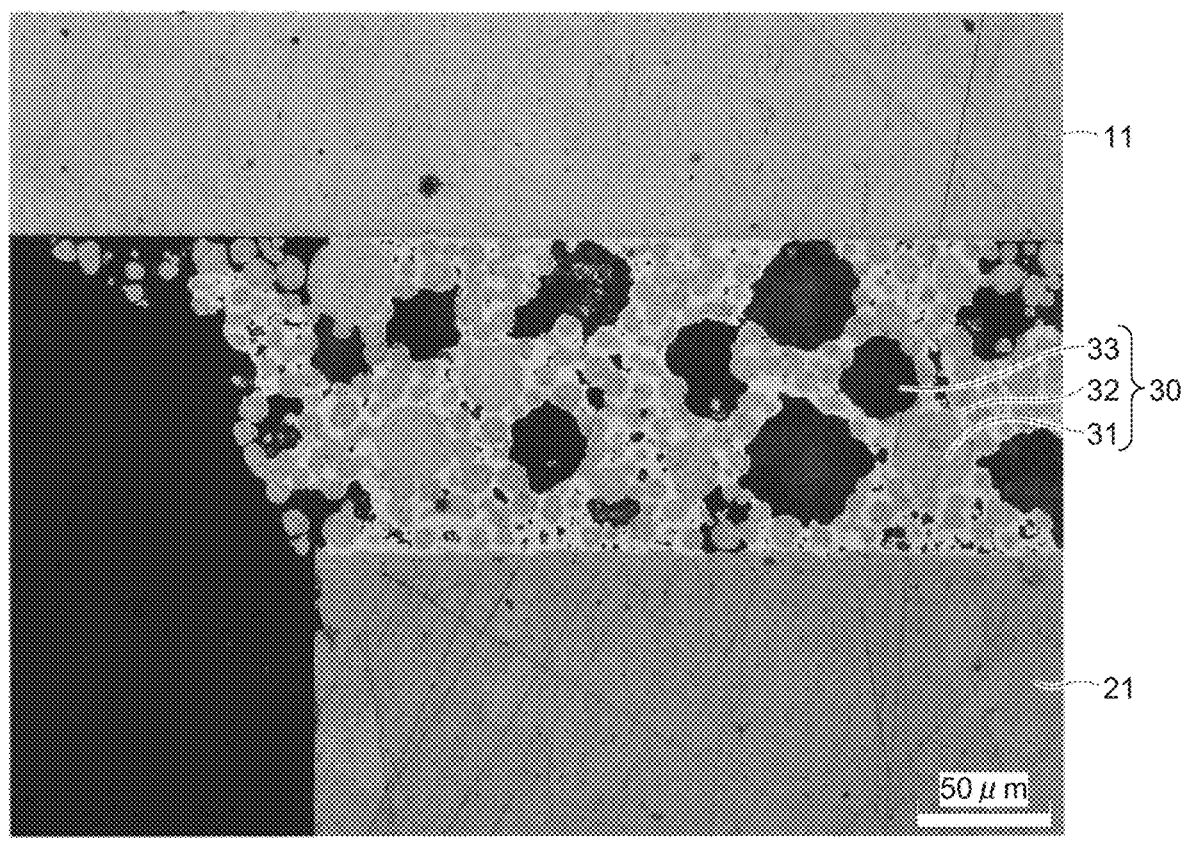
FIG. 3 is an optical micrograph of a cross section illustrating an example of a bonding layer in the thermoelectric module of the present invention.

FIG. 3 is an optical micrograph of a cross section illustrating an example of a bonding layer in the thermoelectric module of the present invention. In the bonding layer 30, a Cu—Sn intermetallic compound 32 is present so as to cover copper-containing particles 31, and a fired resin 33 is dispersed in a metal portion including the copper-containing particles 31 and the Cu—Sn intermetallic compound 32.

The copper-containing particles do not melt to disappear even at a high temperature of 250 to 300° C., and have low electrical resistance. Therefore, when the bonding layer 30 contains the copper-containing particles, a current can efficiently flow between the thermoelectric conversion element and the electrode.

Examples of the copper-containing particles include copper particles, copper alloy particles, and particles obtained by plating surfaces of the copper particles or the copper alloy particles.

The copper-containing particles may contain another element. Examples of the other element include phosphorus, silver, manganese, antimony, silicon, potassium, sodium, lithium, barium, strontium, calcium, magnesium, beryllium, zinc, lead, cadmium, thallium, vanadium, tin, aluminum, zirconium, tungsten, molybdenum, titanium, cobalt, nickel, and gold. The content of the other element in the copper-containing particles is preferably 10% by mass or less.

In the bonding layer 30, copper-containing particles and copper balls each having a particle diameter of 30 μm or more are preferably present in a cross section thereof. By presence of the copper-containing particles and the copper balls each having a particle diameter of 30 μm or more in the bonding layer 30, crushing of the bonding layer 30 is suppressed during pressure-induced bonding or use in a high temperature environment. Therefore, the thickness of the bonding layer 30 can be sufficiently maintained, and sufficient bonding strength can be ensured. In addition, since protrusion of the bonding layer 30 is suppressed, contact of a protruding bonding material with a side surface of the thermoelectric conversion element is suppressed. Therefore, diffusion of copper and tin contained in the bonding material into the thermoelectric conversion element is suppressed, and deterioration of thermoelectric performance in the thermoelectric conversion element is suppressed.

The particle diameter of each of the copper-containing particles and the copper balls in the cross section of the bonding layer 30 is preferably 100 μm or less, and more preferably 50 μm or less. When the particle diameter of each of the copper-containing particles and the copper balls is equal to or less than the upper limit of the above range, the bonding layer 30 does not become too thick, and an increase in electrical resistance of the bonding layer 30 is suppressed.

The total area ratio of the copper-containing particles and the copper balls each having a particle diameter of 30 μor more out of 100% of the cross-sectional area of the bonding layer 30 is preferably 10 to 55%, and more preferably 15 to 50%. When the total area ratio of the copper-containing particles and the copper balls each having a particle diameter of 30 μm or more out of 100% of the cross-sectional area of the bonding layer 30 is equal to or more than the lower limit of the above range, crushing of the bonding layer 30 is sufficiently suppressed. When the total area ratio of the copper-containing particles and the copper balls each having a particle diameter of 30 μm or more out of 100% of the cross-sectional area of the bonding layer 30 is equal to or less than the upper limit of the above range, the bonding layer 30 does not become too thick, and therefore electric power loss is suppressed without an increase in electrical resistance at an interface.

The total area ratio of the copper-containing particles and the copper balls out of 100% of the cross-sectional area of the bonding layer 30 is preferably 35 to 50%, and more preferably 38 to 47%. When the total area ratio of the copper-containing particles and the copper balls out of 100% of the cross-sectional area of the bonding layer 30 is within the above range, a difference between the linear expansion coefficient of the thermoelectric conversion element and the linear expansion coefficient of the bonding layer 30 is small, and generation of a thermal stress between the thermoelectric conversion element and the bonding layer 30 is suppressed. Therefore, breakage at an interface between the thermoelectric conversion element and the bonding layer 30 is suppressed.

When a bonding material containing copper-containing particles and tin-containing particles, which will be described later, is fired, the solid copper-containing particles react with molten tin, and copper and tin undergo transient liquid phase sintering (TLPS) to form the Cu—Sn intermetallic compound. That is, by using the bonding material containing copper-containing particles and tin-containing particles, the thermoelectric conversion element can be bonded to the electrode under the same conditions as lead-free solder (260° C. at which tin melts). The Cu—Sn intermetallic compound having a high melting point (400° C. or higher) does not remelt after bonding. In addition, by inclusion of the Cu—Sn intermetallic compound in the bonding layer 30, the temperature cycle resistance of the thermoelectric module 1 is increased.

Examples of the Cu—-Sn intermetallic compound include $Cu_6Sn_5$ and $Cu_3Sn$. The Cu—Sn intermetallic compound may contain an element other than copper and tin.

The area ratio of the Cu—Sn intermetallic compound out of 100% of the cross-sectional area of the bonding layer 30 is preferably 10 to 30%, and more preferably 14 to 25%. When the area ratio of the CU—Sn intermetallic compound out of 100% of the cross-sectional area of the bonding layer 30 is equal to or more than the lower limit of the above range, sufficient bonding strength can be ensured. When the area ratio of the Cu—Sn intermetallic compound out of 100% of the cross-sectional area of the bonding layer 30 is equal to or less than the upper limit of the above range, crushing of the bonding layer 30 is sufficiently suppressed.

The fired resin is formed by thermally decomposing a resin when the bonding material containing the resin, which will be described later, is fired. Due to the dispersion of the fired resin in the metal portion including the copper-containing particles, the copper balls, and the CU—Sn intermetallic compound, the fired resin is deformed when a thermal stress is generated in the bonding layer 30, and the thermal stress can be relaxed. Therefore, the temperature cycle resistance of the thermoelectric module 1 is further increased.

The area ratio of the fired resin out of 100% of the cross-sectional area of the bonding layer 30 is preferably 30 to 50%, and more preferably 34 to 45%. When the area ratio of the fired resin out of 100% of the cross-sectional area of the bonding layer 30 is equal to or more than the lower limit of the above range, the thermal stress can be relaxed sufficiently. When the area ratio of the fired resin out of 100% of the cross-sectional area of the bonding layer 30 is equal to or less than the upper limit of the above range, a current can efficiently flow between the thermoelectric conversion element and the electrode.

The thickness of the bonding layer 30 is preferably 50 to 150 μm, and more preferably 50 to 120 μm. When the thickness of the bonding layer 30 is equal to or more than the lower limit of the above range, the bonding strength between the thermoelectric conversion element and the electrode is higher. When the thickness of the bonding layer 30 is equal to or less than the upper limit of the above range, an increase in the electrical resistance of the bonding layer 30 is suppressed.

The diffusion preventing layer 40 suppresses diffusion of an element contained in the bonding layer 30 and the bondability improving laye 50 into the thermoelectric conversion element, and thereby suppresses deterioration of thermoelectric performance in the thermoelectric conversion element.

The diffusion preventing layer 40 is made of at least one metal, for example, selected from the group consisting of nickel, molybdenum, tungsten, niobium, and tantalum.

The thickness of the diffusion preventing layer 40 is preferably 0.5 to 20 μm, and more preferably 2.7 to 13 μm.

The bondability improving laye 50 enhances bondability between the bonding layer 30 and the diffusion preventing layer 40.

The bondability improving laye 50 is made of at least one metal, for example, selected from the group consisting of tin, nickel, copper, silver, gold, platinum, aluminum, chromium, and cobalt.

The thickness of the bondability improving laye 50 is preferably 0.1 to 5 μm, and more preferably 0.2 to 3 μm.

<Method for Manufacturing Thermoelectric Module>

The thermoelectric module 1 can be manufactured, for example, by a method including the following steps S1 to S4.

(Step S1)

A thermoelectric material molded into a predetermined shape in advance is prepared, and pretreatment is performed as necessary.

The thermoelectric material may be formed into an element shape or may have a plate shape.

Examples of the pretreatment include reverse sputtering in an argon gas atmosphere. Reverse sputtering is a type of dry etching, and by sputtering a surface of a thermoelectric material with argon ions, an oxide film formed on the surface of the thermoelectric material and dirt adhering to the surface are removed.

(Step S2)

The diffusion preventing layer 40 is formed on upper and lower surfaces of the thermoelectric material by performing ion plating or sputtering using a metal material such as molybdenum, tungsten, niobium, or tantalum.

(Step S3)

The bondability improving laye 50 is formed on a surface of the diffusion preventing layer 40 by performing ion plating or sputtering using a metal material such as nickel, copper, silver, gold, platinum, aluminum, chromium, or cobalt.

Steps S1 to S3 are preferably performed continuously in the same vacuum chamber.

When the thermoelectric material has a plate shape, after step S3, the plate-shaped thermoelectric material is cut into an element shape.

In this way, a thermoelectric conversion element (p-type element 21 or n-type element 22) in which the diffusion preventing layer 40 and the bondability improving laye 50 are formed on upper surface and lower surfaces thereof is obtained.

(Step S4)

A paste-like bonding material is sandwiched between the surface-processed thermoelectric conversion element and the electrode, and the bonding material is fired in a state where pressure is applied to the bonding material to bond thermoelectric conversion element to the electrode via the bonding layer 30.

Examples of the bonding material include a material obtained by blending copper-containing particles and copper balls each having a relatively large particle diameter in a commercially available metal paste containing copper-containing particles each having a relatively small particle diameter (hereinafter, also referred to as "copper fine particles"), tin-containing particles, a resin, a solvent, an additive, and the like.

The content of each component in the bonding material only needs to be appropriately adjusted such that the area ratio of each component (total area ratio) in the bonding layer 30 is within the above-described range.

Examples of the form and material of the copper fine particle include those similar to the form and material of the copper-containing particle in the bonding layer 30.

The volume-based cumulative 50% diameter (hereinafter, also referred to as "$D_{50}$") of the copper fine particles determined by a laser diffraction/scattering method is preferably 0.4 to 10 μm, and more preferably 1 to 7 μm.

Examples of the tin-containing particles include tin particles and tin alloy particles.

The purity of tin in the tin particles is preferably 95% by mass or more, preferably 97% by mass or more, and more preferably 99% by mass or more.

The tin content in the tin alloy particles is preferably 1% by mass or more, preferably 3% by mass or more, and more preferably 5% by mass or more.

Examples of the tin alloy particles include Sn-3.5Ag, Sn-0.7Cu, Sn-3.0Ag-0.5Cu, Sn-3.2Ag-0.5Cu, Sn-4Ag-0.5Cu, Sn-2.5Ag-0.8Cu-0.5Sb, Sn-2Ag-7.5Bi, Sn-3Ag-5Bi, Sn-58Bi, Sn-3.5Ag-3In-0.5Bi, Sn-3Bi-8Zn, Sn-9Zn, Sn-52In, and Sn-40Pb.

The $D_{50}$ of the tin-containing particles is preferably 0.5 to 20 μm, and more preferably 1 to 15 μm.

The commercially available metal paste may contain silver particles.

The silver particles may contain another element. The content of the other element in the silver particles is preferably 3% by mass or less, and more preferably 1% by mass or less.

The $D_{50}$ of the silver particles is preferably 0.4 to 10 μm, and more preferably 1 to 7 μm.

Examples of the resin include a cellulose-based resin, polyvinyl alcohol, polyvinylpyrrolidone, an acrylic resin, a vinyl acetate-acrylate copolymer, a butyral resin, an alkyd resin, an epoxy resin, a phenol resin, a rosin ester resin, and thermoplastic polyimide.

Examples of the solvent include a hydrocarbon-based solvent, a chlorinated hydrocarbon-based solvent, a cyclic ether-based solvent, an amide-based solvent, a sulfoxide-based solvent, a ketone-based solvent, an alcohol-based solvent, a polyhydric alcohol ester-based solvent, a polyhydric alcohol ether-based solvent, and a terpene-based solvent.

Examples of the additive include a thixotropic agent, an antioxidant, a flux, a plasticizer, a dispersant, a surfactant, an inorganic binder, a metal oxide, ceramics, and an organic metal compound.

The copper ball is a copper ball-shaped object having a particle diameter of 30 μm or more. Note that the form and material of the copper ball may be similar to the form and material of the copper-containing particle in the bonding layer 30.

The $D_{50}$ of the copper balls is preferably 20 to 38 μm.

When the bonding material is fired at a high temperature (260° C.), solid copper-containing particles react with molten tin, and copper and tin undergo transitional liquid phase sintering (TLPS) to form a Cu—Sn intermetallic compound. Although surfaces of the copper balls contained in the bonding material react with molten tin, many parts of the copper balls remain as particles, and form copper-containing particles each having a particle diameter of 30 μm or more in the bonding layer 30. The resin contained in the bonding material is thermally decomposed by firing, and a part of the resin is left in the bonding layer 30 as a fired resin. The solvent contained in the bonding material volatilizes by firing.

<Method for Using Thermoelectric Module>

The thermoelectric module is used by bringing a heat source (heat exchanger or the like) into contact with either or both of a high temperature side (high temperature side substrate or high temperature side electrode) and a low temperature side (low temperature side substrate or low temperature side electrode).

For example, when a thermoelectric module having a full skeleton structure is used, in a state where a thermally conductive grease is present between the thermoelectric module and the heat exchanger, pressure is applied between the thermoelectric module and the heat exchanger in a direction orthogonal to a plane direction.

The pressure applied between the thermoelectric module and the heat exchanger is preferably 196 kN/m² or more from a viewpoint of reducing thermal resistance between the thermoelectric module and the heat exchanger. When the area ratio of copper-containing particles each having a particle diameter of 30 μm or more in the bonding layer is 10% or more, crushing of the bonding layer is suppressed even when pressure of 196 kN/m² or more is applied.

EXAMPLE

Hereinafter, the present invention will be described in more detail with reference to Example, but the present invention is not limited to these Examples.

(Area ratio of each component in cross section of bonding layer)

The area ratio of each component in the cross section of the bonding layer was determined as follows.

Ten bonding portions were randomly selected from the inside of one thermoelectric module. The cross section of each of the bonding portions was observed with an optical microscope (manufactured by KEYENCE, VHX-6000) at a magnification of 1000 times. A bonding layer was selected using image processing software attached to the VHX-6000 in an optical micrograph of the cross section of the bonding portion, and the area of the bonding layer was measured.

The copper-containing particles and the copper balls in the bonding layer were automatically detected using image processing software in the optical micrograph of the cross section of the bonding portion, the area of each of the copper-containing particles and the area of each of the copper balls were measured, circle-equivalent diameters of each of the copper-containing particles and each of the copper balls were determined, the area of each of the copper-containing particles and the area of each of the copper balls were summed up to determine the total area of the copper-containing particles and the copper balls, and a percentage of the total area of the copper-containing particles and the copper balls with respect to the area of the bonding layer was calculated to be determined. Out of the detected copper-containing particles and copper balls, the total area of only the copper-containing particles and the copper balls each having a circle-equivalent diameter of 30 µm or more was determined, and a percentage of the total area of the copper-containing particles and the copper balls each having a circle-equivalent diameter of 30 µm or more with respect to the area of the bonding layer was calculated to be determined.

All black portions (fired resin and the like) in the bonding layer were automatically detected using image processing software in the optical micrograph of the cross section of the bonding portion, the area of the black portions was determined, and a percentage of the area of the black portions with respect to the area of the bonding layer was calculated to be determined.

The area other than the area of the copper-containing particles, the copper balls, and the black portions was determined by the area of the bonding layer−(the area of the copper-containing particles+the area of the copper balls+the area of the black portions), and this area was taken as the area of the Cu—Sn intermetallic compound. The percentage of the area of the Cu—Sn intermetallic compound with respect to the area of the bonding layer was calculated to be determined.

The total area ratio of the copper-containing particles and the copper balls out of 100% of the cross-sectional area of the bonding layer and the total area ratio of the copper-containing particles and the copper balls each having a particle diameter of 30 µm or more out of 100% of the cross-sectional area of the bonding layer were determined by averaging values in ten bonding portions. The area ratio of the Cu—Sn intermetallic compound out of 100% of the cross-sectional area of the bonding layer and the area ratio of the black portions out of 100% of the cross-sectional area of the bonding layer were determined by averaging values in five bonding portions.

(Temperature Cycle Test)

Figure 4:
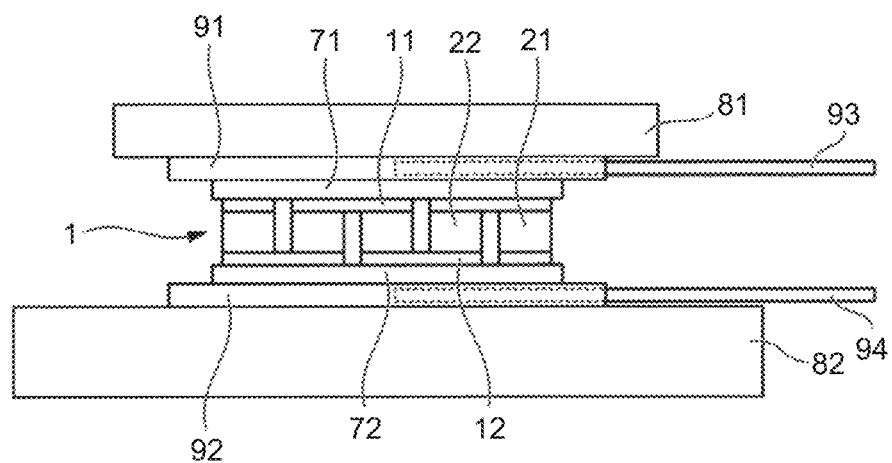
FIG. 4 is a schematic view illustrating a state of a temperature cycle test.

As illustrated in FIG. 4, the thermoelectric module 1 was sandwiched between a heater 81 and a cooling plate 82 from above and below via an aluminum nitride substrate 91 and an aluminum nitride substrate 92 for temperature measurement, and pressurized at about 2 MPa. As the temperature on a high temperature side, the temperature of the aluminum nitride substrate 91 was measured using a thermocouple 93. As the temperature on a low temperature side, the temperature of the aluminum nitride substrate 92 was measured using a thermocouple 94.

For the thermoelectric module 1, a cycle of fixing the temperature on the low temperature side at 50° C. in the atmosphere, raising the temperature on the high temperature side from 70° C. to 250° C. in five minutes, holding the temperature at 250° C. for ten minutes, and lowering the temperature from 250° C. to 70° C. in five minutes was repeated 15,000 times. An open electromotive force and a maximum output were measured while the temperature was held at 250° C. for 10 minutes. The electrical resistance of the thermoelectric module 1 at 250° C. and the electrical resistance of the thermoelectric module 1 at 60° C. were measured every 50 cycles. The electrical resistance of the thermoelectric module 1 was measured between the lead 61 and the lead 62.

Example 1

As a thermoelectric material for the p-type element, a plate-shaped thermoelectric material containing bismuth, tellurium, and antimony as main components was prepared. As a thermoelectric material for the n-type element, a plate-shaped thermoelectric material containing bismuth, tellurium, and selenium as main components was prepared.

A diffusion preventing layer made of nickel and a bondability improving layer made of tin were sequentially formed on an upper surface and a lower surface of each of the thermoelectric materials by an ion plating method.

The plate-shaped thermoelectric materials were cut into an element shape to obtain a surface-processed p-type element and a surface-processed n-type element.

15.7% by mass of copper fine particles having $D_{50}$ of 3 µm, 62.9% by mass of copper particles having $D_{50}$ of 25 µm, 14.2% by mass of tin alloy particles (Sn-3.0Ag-0.5Cu) having $D_{50}$ of 3 µm, 1.5% by mass of tin alloy particles (Sn-3.0Ag-0.5Cu) having $D_{50}$ of 25 µm, 0.7% by mass of epoxy resin, 1.5% by mass of rosin, 0.4% by mass of thixotropic agent, 1.5% by mass of activator, 0.1% by mass of antioxidant, and 1.5% by mass of solvent were mixed to obtain a metal paste.

Copper balls having $D_{50}$ of 29 µm were added to the metal paste such that the content of the copper balls was 7.5% by mass, and the resulting mixture was stirred to obtain a paste-like bonding material.

Figure 5:
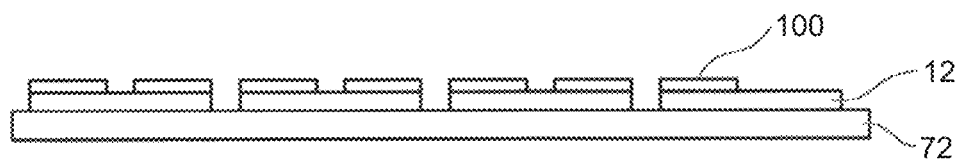
FIG. 5 is a schematic view illustrating a part of a process of manufacturing a thermoelectric module in Example.

As illustrated in FIG. 5, a product obtained by bonding the low temperature side electrode 12 to a surface of the low temperature side substrate 72 was prepared. Similarly to this, a product obtained by bonding the high temperature side electrode 11 to a surface of the high temperature side substrate 71 was prepared. A paste-like bonding material 100 was applied to surfaces of the low temperature side electrode 12 and the high temperature side electrode 11.

Figure 6:
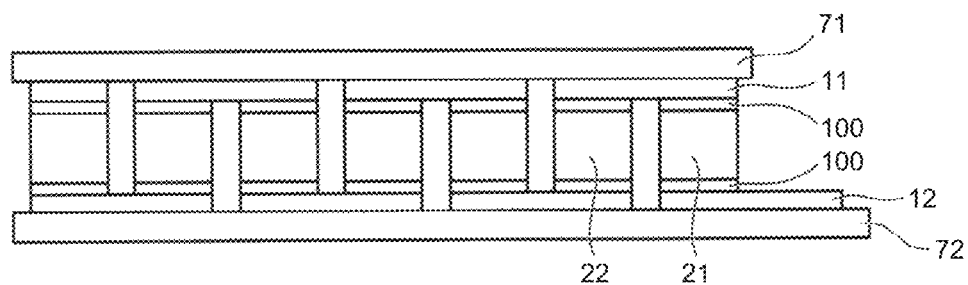
FIG. 6 is a schematic view illustrating a part of the process of manufacturing a thermoelectric module in Example.

As illustrated in FIG. 6, the surface-processed p-type element 21 and n-type element 22 were placed on the paste-like bonding material 100. The high temperature side electrode 11 coated with the paste-like bonding material 100 was placed on the surface-processed p-type element 21 and n-type element 22.

The resulting product was heated at 250° C. for one to two minutes in a state where a pressure of 0.01 MPa was applied thereto from above and below, and the electrode was bonded to the thermoelectric conversion element with a bonding layer made of a fired product of the bonding material. A thermoelectric module including 199 pairs of pn elements as illustrated in FIG. 1 was obtained.

The thickness of the bonding layer was 118 µm. No crushing of the bonding layer during bonding between the thermoelectric conversion element and the electrode and no breakage at an interface between the thermoelectric conversion element and the bonding layer were observed.

Table 1 illustrates the area ratio of each component in the cross section of the bonding layer.

Figure 7:
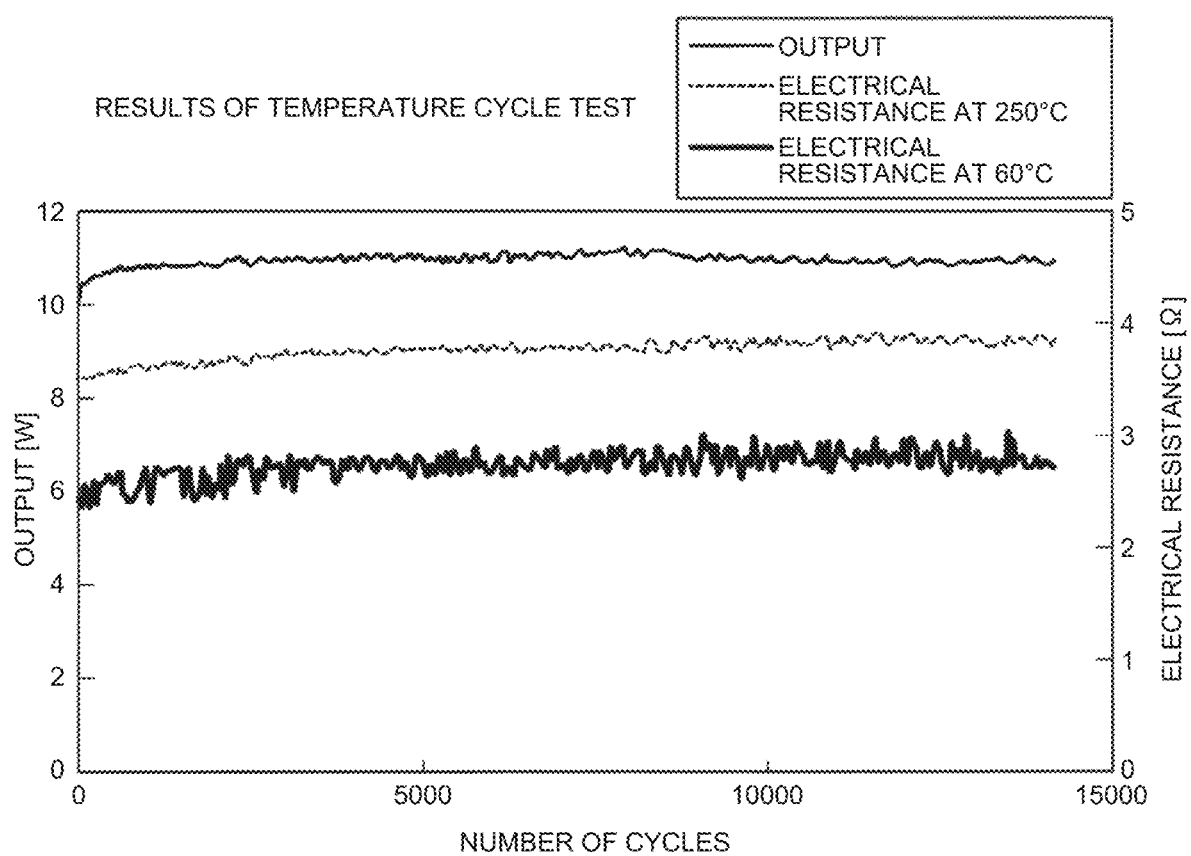
FIG. 7 is a graph illustrating results of a temperature cycle test of a thermoelectric module of Example 1.

FIG. 7 illustrates results of the temperature cycle test. No decrease in output was observed after 15,000 cycles.

TABLE 1

| Evaluation No. | Total area of copper-containing particles and copper balls/area of bonding layer [%] | Total area of copper-containing particles and copper balls having particle diameters of 30 μm or more/area of bonding layer [%] | Area of Cu—Sn intermetallic compound/area of bonding layer [%] | Area of black portions/area of bonding layer [%] | Area of bonding layer [%] | Circle-equivalent diameter of copper-containing particle Minimum [μm] | Circle-equivalent diameter of copper-containing particle Maximum [μm] |
|---|---|---|---|---|---|---|---|
| 1 | 39.4 | 43.6 | 18.4 | 42.2 | 100 | 0 | 38 |
| 2 | 43.0 | 27.8 | 14.7 | 42.3 | 100 | 0 | 41 |
| 3 | 40.5 | 46.0 | 24.9 | 34.5 | 100 | 0 | 47 |
| 4 | 44.5 | 23.4 | 13.6 | 41.9 | 100 | 2 | 41 |
| 5 | 42.1 | 15.3 | 16.7 | 41.1 | 100 | 4 | 35 |
| 6 | 39.0 | 27.2 | | | 100 | 0 | 37 |
| 7 | 38.2 | 37.9 | | | 100 | 0 | 38 |
| 8 | 38.1 | 40.8 | | | 100 | 0 | 47 |
| 9 | 46.9 | 50.3 | | | 100 | 0 | 45 |
| 10 | 44.2 | 39.8 | | | 100 | 0 | 39 |
| Average | 41.6 | 35.2 | 17.7 | 40.4 | 100 | — | — |

INDUSTRIAL APPLICABILITY

The thermoelectric module of the present invention can be used for thermoelectric power generation that generates power by utilizing a temperature difference.

The invention claimed is:

1. A thermoelectric module comprising:
a plurality of electrodes;
thermoelectric conversion elements arranged between the electrodes; and
a bonding layer disposed between the electrodes and the thermoelectric conversion elements,
wherein the bonding layer comprises:
copper-containing particles having a volume-based cumulative 50% diameter ($D_{50}$) that is 1 to 7 μm,
copper balls having particle diameters of 30 μm or more, each of the particle diameters of the copper balls being greater than the $D_{50}$ of the copper-containing particles,
an intermetallic compound of copper and tin, the intermetallic compound surrounding the copper-containing particles and the copper balls, and
a fired resin dispersed in a metal portion including the copper-containing particles and the intermetallic compound, and
wherein a total area ratio of the intermetallic compound with respect to a cross-sectional area of the bonding layer is 10 to 30%.

2. The thermoelectric module according to claim 1, wherein the copper-containing particles and the copper balls are present in a cross section of the bonding layer, and
wherein a total area ratio of the copper-containing particles and the copper balls with respect to the cross-sectional area of the bonding layer is 10 to 55%.

3. The thermoelectric module according to claim 2, wherein the total area ratio of the copper-containing particles and the copper balls with respect to the cross-sectional area of the bonding layer is 35 to 50%.

4. The thermoelectric module according to claim 1, further comprising a diffusion preventing layer disposed between the thermoelectric conversion elements and the bonding layer.

5. The thermoelectric module according to claim 4, further comprising a bondability improving layer disposed between the bonding layer and the diffusion preventing layer.

6. The thermoelectric module according to claim 1, wherein the bonding layer has a thickness of 50 to 150 μm.

7. The thermoelectric module according to claim 1, wherein a $D_{50}$ of the copper balls is 20 to 38 μm.

8. The thermoelectric module according to claim 1, wherein the bonding layer is in direct contact with one of the plurality of electrodes.

9. The thermoelectric module according to claim 1, wherein the copper-containing particles include copper and another element including at least one of silver, manganese, antimony, silicon, potassium, sodium, lithium, barium, strontium, calcium, magnesium, beryllium, zinc, lead, cadmium, thallium, vanadium, tin, aluminum, zirconium, tungsten, molybdenum, titanium, cobalt, nickel, or gold.

10. The thermoelectric module according to claim 9, wherein a weight ratio of the another element in the copper-containing particles is 10% or less.

11. The thermoelectric module according to claim 5, wherein the bondability improving layer is disposed between the bonding layer and the diffusion preventing layer and in contact with the bonding layer and the diffusion preventing layer.

12. The thermoelectric module according to claim 11, wherein the bondability improving layer is made of at least one of tin, nickel, copper, silver, gold, platinum, aluminum, chromium, or cobalt.

13. The thermoelectric module according to claim 11, wherein the diffusion preventing layer is made of molybdenum, tungsten, niobium, or tantalum.

14. The thermoelectric module according to claim 11, wherein the bonding layer has a thickness of 50 to 150 μm.

15. The thermoelectric module according to claim 11, wherein the diffusion preventing layer has a thickness of 0.5 to 20 μm.

16. The thermoelectric module according to claim 11, wherein the bondability improving layer has a thickness of 0.1 to 5 μm.

17. The thermoelectric module according to claim 1, wherein the bonding layer has a thickness of 50 to 120 μm.

18. The thermoelectric module according to claim 1, wherein the $D_{50}$ of the copper-containing particles is determined by a laser diffraction/scattering method.

19. The thermoelectric module according to claim 1, wherein the fired resin is a part of a resin that is left in the bonding layer after the resin is thermally decomposed by firing.

20. The thermoelectric module according to claim 1, wherein the total area ratio of the intermetallic compound with respect to the cross-sectional area of the bonding layer is 14 to 25%.

* * * * *